(12) United States Patent
Camponeschi et al.

(10) Patent No.: US 10,958,280 B2
(45) Date of Patent: Mar. 23, 2021

(54) APPARATUS FOR CALIBRATING AN ANALOG-TO-DIGITAL CONVERTER

(71) Applicant: Intel Corporation, Santa Clara, CA (US)

(72) Inventors: Matteo Camponeschi, Villach (AT); Christian Lindholm, Villach (AT)

(73) Assignee: Intel Corporation, Santa Clara, CA (US)

(\*) Notice: Subject to any disclaimer, the term of this patent is extended or adjusted under 35 U.S.C. 154(b) by 0 days.

(21) Appl. No.: 16/788,338

(22) Filed: Feb. 12, 2020

(65) Prior Publication Data

US 2020/0313688 A1 Oct. 1, 2020

(30) Foreign Application Priority Data

Mar. 29, 2019 (DE) .......................... 102019108176.9

(51) Int. Cl.
*H03M 1/10* (2006.01)
*H03M 1/46* (2006.01)
*H03M 1/56* (2006.01)
*H03M 1/12* (2006.01)

(52) U.S. Cl.
CPC ....... *H03M 1/1028* (2013.01); *H03M 1/1033* (2013.01); *H03M 1/1245* (2013.01); *H03M 1/462* (2013.01); *H03M 1/56* (2013.01)

(58) Field of Classification Search
CPC ...... H03M 1/1028; H03M 1/462; H03M 1/56; H03M 1/1245; H03M 1/1033
USPC .................................................. 341/120, 143
See application file for complete search history.

(56) References Cited

U.S. PATENT DOCUMENTS

| | | | |
|---|---|---|---|
| 7,129,875 B1 * | 10/2006 | Altun .................... | H03M 3/322 341/143 |
| 7,253,764 B2 * | 8/2007 | Wang ...................... | H03M 1/66 341/143 |
| 7,456,769 B2 * | 11/2008 | Wang ................... | G11C 27/024 341/143 |
| 7,710,303 B2 * | 5/2010 | Wojewoda .......... | H03M 1/1028 341/155 |

\* cited by examiner

*Primary Examiner* — Khai M Nguyen
(74) *Attorney, Agent, or Firm* — 2SPL Patent Attorneys PartG mbB; Yong Beom Hwang

(57) ABSTRACT

An apparatus for calibrating an analog-to-digital converter is provided. The apparatus includes a reference input generation circuit configured to subsequently generate two reference inputs for calibrating the analog-to-digital converter. The two reference inputs both represent ramp waveforms, wherein the ramp waveforms represented by the two reference inputs are different from each other. Further, the apparatus includes a coupling circuit configured to controllably couple an input node of the analog-to-digital converter to either the reference input generation circuit or to a signal node capable of providing an analog input for digitization.

20 Claims, 10 Drawing Sheets

350

150'

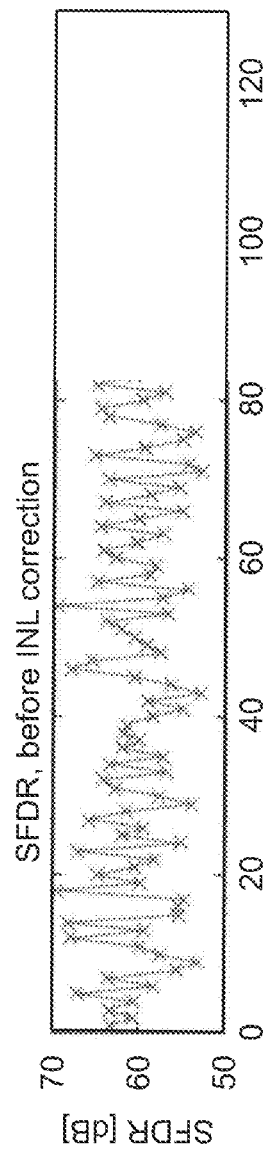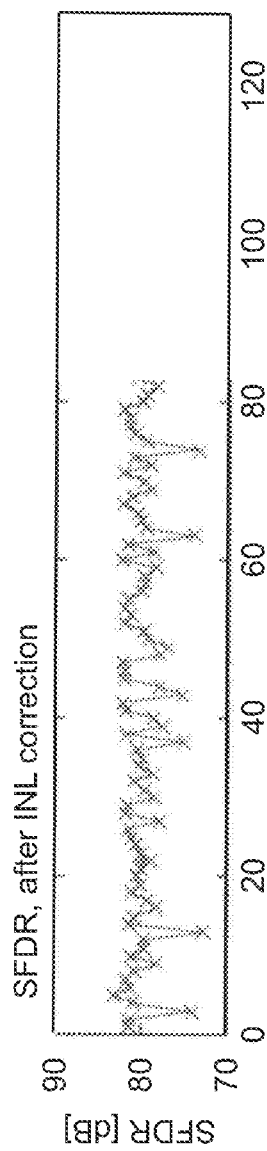

APPARATUS FOR CALIBRATING AN ANALOG-TO-DIGITAL CONVERTER

CROSS REFERENCE TO RELATED APPLICATIONS

This application claims priority under 35 U.S.C. § 119 to German Patent Application No. 10 2019 108 176.9, filed Mar. 29, 2019, which is incorporated by reference as if fully set forth herein.

FIELD

The present disclosure relates to analog-to-digital conversion. In particular, examples relate to an apparatus for calibrating an Analog-to-Digital Converter (ADC), a receiver, a base station and a mobile device.

BACKGROUND

Modern receivers use ADCs in order to convert analog receive signals to digital receive data for further processing the receive data in the digital domain. The requirements for receivers are getting tougher with each new communication standard.

One aspect causing performance degradation of an ADC is Integral Non-Linearity (INL). Conventionally, INL calibration of an ADC is done by comparing the non-ideal ADC output to a reference input pattern (signal). A high quality reference input pattern is required at the input of the ADC in order to achieve a high calibration precision. For example, a low frequency sinewave or a linear ramp may be used as reference. A high quality of these references is required. Extra design effort is conventionally required for generating these references as any non-linearity limits the accuracy of the references and, hence, the calibration.

Hence, there may be a desire for an improved calibration architecture.

BRIEF DESCRIPTION OF THE FIGURES

Some examples of apparatuses and/or methods will be described in the following by way of example only, and with reference to the accompanying figures, in which

FIGS. 11A and 11B illustrate exemplary spurious-free dynamic ranges for uncalibrated and calibrated ADCs;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
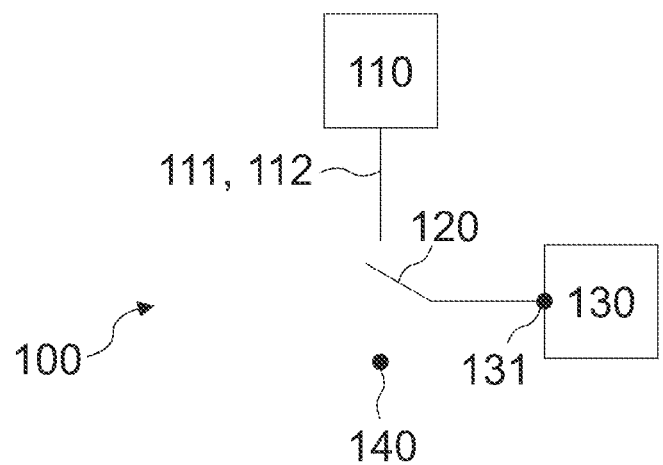
FIG. 1 illustrates an example of an apparatus for calibrating an ADC.

FIG. 1 illustrates an example of an apparatus 100 for calibrating an ADC 130 that may enable INL calibration of the ADC 130 with reduced complexity in the analog domain (i.e. for generating the calibration input for the ADC 130). The ADC 130 may, e.g., be a Successive Approximation Register (SAR) ADC, a flash ADC (also referred to as direct conversion ADC) or a pipeline ADC. However, the proposed architecture is not limited to these types of ADCs.

The apparatus 110 comprises a reference input generation circuit 110 configured to subsequently generate two reference inputs 111 and 112 for calibrating the ADC 130. The two reference inputs 111 and 112 both represent ramp waveforms. The ramp waveforms represented by the two reference inputs 111 and 112 are different from each other. A variety of ramp waveforms may be used. For example, the ramp waveforms represented by the two reference inputs 111 and 112 may exhibit different slopes, i.e. one of the ramp waveforms may be steeper than the other. The ramp waveforms represented by the two reference inputs 111 and 112 may exhibit opposite slopes, i.e. one ramp waveform may be a rising ramp and the other ramp waveform may be a falling ramp. In some examples, the ramp waveforms represented by the two reference inputs 111 and 112 may be exponential ramps.

Additionally, the apparatus 100 comprises a coupling circuit 120 configured to controllably couple an input node 131 of the ADC 130 to either the reference input generation circuit 110 or to a signal node 140 capable of providing an analog input for digitization. For example, the coupling circuit 120 may be configured to controllably couple the input node 131 of the ADC 130 to either the reference input generation circuit 110 or to the signal node 140 based on a control input indicative of a desired operation mode of the ADC 130. If the ADC 130 is to be calibrated (i.e. the ADC 130 operates in a calibration mode), the coupling circuit 120 may couple the input node 131 of the ADC 130 to the reference input generation circuit 110 so that the two reference inputs 111 and 112 are subsequently supplied as input to the ADC 130. On the other hand, if the ADC 130 is to digitize an analog input such as an analog Radio Frequency (RF) signal carrying user data (i.e. the ADC 130 operates in a regular/normal operation mode), the coupling circuit 120 may couple the input node 131 of the ADC 130 to the signal node 140 so that the analog signal is supplied as input to the ADC 130. For example, the coupling circuit 120 may be implemented using one or more switches (e.g. analog switches such as Metal-Oxide-Semiconductor, MOS, transistors) or one or more (programmable) attenuators (e.g. attenuating the reference inputs 111 and 112 if the ADC 130 is to digitize an analog signal provided by the signal node 140, and vice versa).

Figure 2:
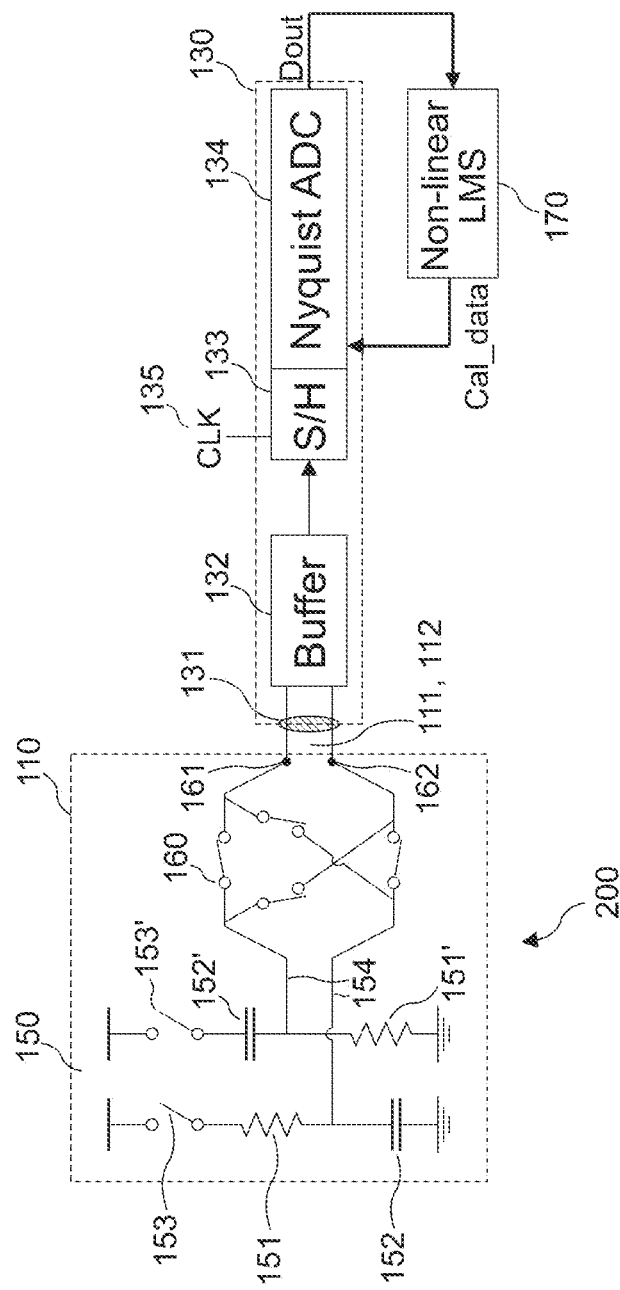
FIG. 2 illustrates another example of an apparatus for calibrating an ADC.

The apparatus 100 may allow selective offline calibration of the ADC 130 by selective coupling the input of the ADC 130 to either the reference input generation circuit 110 or to the signal node 140. Further, the two reference inputs 111 and 112 may allow to calibrate an INL of the ADC 130 as will be described below in detail with reference to FIGS. 2 to 11B. FIG. 2 illustrates a more detailed example of an apparatus 200 for calibrating ADC 130. In FIG. 2, also the ADC 130 is illustrated in detail. In the example of FIG. 2, the ADC 130 is implemented differentially.

The ADC 130 comprises the differential input node 131 configured to receive an analog input for the ADC 130. Similar to what is described above, the input node 131 may either be coupled to the reference input generation circuit 110 or to a signal node capable of providing an analog input for digitization (e.g. an RF receive signal). Since the following description will focus on the calibration of the ADC 130, the coupling circuit of the apparatus 200 is omitted in FIG. 2 for reasons of simplicity such that the reference input generation circuit 110 is directly coupled to the ADC 130 in FIG. 2.

The ADC 130 is illustrated schematically in FIG. 2 by means of an input buffer 132 that is coupled to the input node 131 and provides the analog input to a sample circuit 133 for sampling the analog input based on a clock input 135. The samples generated by the sample circuit 133 are further processed by a conversion circuit 134 of the ADC 130. For example, if the ADC 130 is implemented as a SAR ADC, the conversion circuit 134 represents the SAR, the Digital-to-Analog Converter (DAC), the comparator etc. of the SAR ADC.

Figure 4:
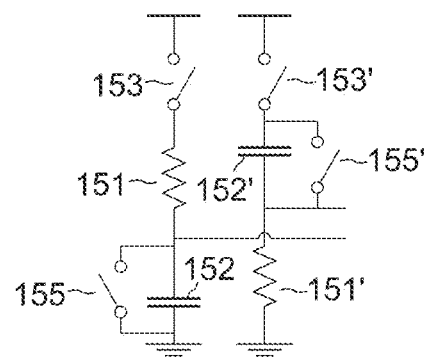

The reference input generation circuit 110 for generating the reference inputs 111 and 112 for the ADC 130 comprises an RC circuit 150 configured to subsequently generate two auxiliary ramp waveforms. The RC circuit is implemented differential since the ADC 130 is differential. Each branch of the RC circuit 150 comprises a resistive element 151, 151' and a capacitive element 152, 152' coupled in series between a (first node at a) first potential (e.g. a supply voltage $V_{dd}$) and a (second node at a) second potential (e.g. ground or a supply voltage $V_{ss}$). If the switches 153, 153' are closed, the capacitive elements 152, 152' are charged via the resistive elements 151, 151'. Therefore, the auxiliary ramp waveform generated by the two branches of the RC circuit 150 is an exponential ramp. The auxiliary ramp waveform is represented by a differential pair of signals 154. By controllably closing the switches 153, 153' two times in a row for repeatedly charging the capacitive element 152, 152', the two auxiliary ramp waveforms are generated. It is to be noted that switches for discharging the capacitive element 152, 152' in between are not illustrated in FIG. 2. FIG. 4 illustrates a complemented RC circuit 150' that additionally comprises the switch 155, 155' in each branch for discharging the respective capacitive element 152, 152'.

Each of the two reference inputs 111 and 112 for the ADC 130 is based on one of the two auxiliary ramp waveforms so that the ramp waveforms represented by the two reference inputs 111 and 112 are exponential ramps.

The two auxiliary ramp waveforms subsequently generated by the RC circuit 150 are substantially equal since the RC circuit 150 subsequently generates the two auxiliary ramp waveforms using the same RC time constant τ:

$$\tau = R \cdot C \qquad (1),$$

with R denoting the resistance of the resistive elements 151, 151' and C denoting the capacitance of the capacitive elements 152, 152'.

For generating the different reference inputs 111 and 112 from the substantially equal auxiliary ramp waveforms, the reference input generation circuit 110 is followed by a slope selection circuit 160. The slope selection circuit 160 allows to invert the slope of auxiliary ramp waveforms. In particular, a first setting of the four switches of the slope selection circuit 160 allows to configure the slope selection circuit 160 to selectively output a first one of the differential pair of signals 154 to a first output node 161 of the reference input generation circuit 110 and a second one of the differential pair of signals 154 to a second output node 162 of the reference input generation circuit 110 in order to provide the first one of the two reference inputs 111 and 112 for calibrating the ADC 130. A different second setting of the four switches of the slope selection circuit 160 allows to configure the slope selection circuit 160 to subsequently output the second one of the differential pair of signals 154 to the first output node 161 of the reference input generation circuit 110 and the first one of the differential pair of signals 154 to the second output node 162 of the reference input generation circuit 110 in order to provide the second one of the two reference inputs 111 and 112 for calibrating the ADC 130.

For the first setting, the lower and the upper switch are closed, whereas the left and the right switch are opened. For the second setting, the left and the right switch are closed, whereas the lower and the upper switch are opened. In other words, the slope selection circuit 160 allows to reverse the polarity of the input. As described above, for providing the first one of the two reference inputs 111 and 112, the first one of the two auxiliary ramp waveforms is allowed to pass through the slope selection circuit 160 without change of the polarity. For providing the second one of the two reference inputs 111 and 112, the second one of the two substantially equal auxiliary ramp waveforms is inverted in its polarity by the slope selection circuit 160. In other words, by switching different pairs of the four switches, the polarity the ramp waveform represented by the differential pair of signals 154 may be inverted.

Figure 8:
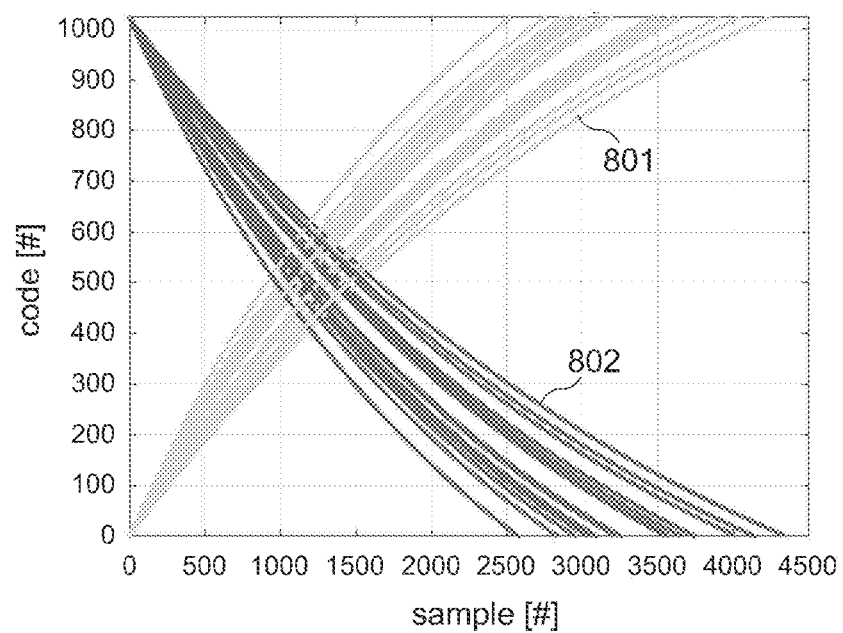
FIG. 8 illustrates exemplary ramp waveforms.

Exemplary exponential ramp waveforms 801 and 802 as represented by the reference inputs 111 and 112 are illustrated in FIG. 8 as corresponding digital output values after digitization by the ADC 130. The exponential ramp waveforms 801 represented by the first reference input 111 exhibit positive polarity, i.e. a rising slope, and different RC time constants. The exponential ramp waveforms 802 represented by the second reference input 112 exhibit negative polarity, i.e. a falling slope, and different RC time constants. In other words, the ramp waveforms represented by the two reference inputs 111 and 112 exhibit opposite slopes. The RC time constants of the ramp waveforms 801 and 802 may, e.g., vary among different physical implementations of the same RC circuit 150 due to process variations. However, as can be seen from FIG. 8, the ADC 130 is capable of tolerating a wide variation of the RC time constant τ of the RC circuit 150.

Both exponential ramp waveforms 801 and 802 should be slow enough such that all possible digital output values the ADC 130 are toggled at least once by the exponential ramp waveforms 801 and 802. Therefore, the RC time constant τ of the RC circuit 150 may be selected based on properties of the ADC 130. For example, the RC time constant τ of the RC circuit 150 may be proportional to a (bit) resolution of the ADC 130. The RC time constant τ of the RC circuit 150 may, e.g., be inversely proportional to a sample rate of the ADC 130. Further, the RC time constant τ of the RC circuit 150 may be inversely proportional to a full scale of the ADC 130. The full scale value of the ADC 130 is the maximum digital value that can be represented by the output of the ADC 130. Summarizing the above, the RC time constant τ of the RC circuit 150 may be defined as follows:

$$\tau \geq \frac{2^n \cdot G}{F_{FS} \cdot F_{ADC}}, \quad (2)$$

with n denoting the bit resolution of the ADC 130, $F_{ADC}$ denoting the sample rate of the ADC 130, $F_{FS}$ denoting the full scale of the ADC 130, and G denoting a gain of elements coupled between the coupling circuit of the apparatus 200 and the ADC 130 (e.g. the buffer 132). It can be seen from mathematical expression three that the RC time constant τ of the RC circuit 150 is smaller for low resolution ADCs and/or high sample rates of the ADC.

For calibrating, first, the first one of the two reference inputs is generated so that an exponential ramp waveform with either positive or negative polarity is input to the ADC 130. In the following, it will be assumed that initially the exponential ramp waveform with positive polarity is input to the ADC 130. Therefore, the ADC 130 samples the exponential ramp waveform with positive polarity and outputs corresponding digital output values. This data is stored for later post-processing. After, the ramp polarity is reversed, i.e. the second one of the two reference is input to the ADC 130. Accordingly, the ADC 130 samples the exponential ramp waveform with negative polarity and outputs corresponding digital output values. Also this data is stored for later post-processing.

For evaluating the digital output values of the ADC 130, the apparatus 200 additionally comprises a processing circuit 170. The processing circuit 170 initially estimates the RC time constant τ of the RC circuit 150 and a DC offset of the digital output values of the ADC 130 (e.g. coming from non-ideal switches). For example, a Least Mean Squares (LMS) algorithm (engine) may be used for processing the non-iterative fitting. Since the digital output values of the ADC 130 relate to two reference inputs representing exponential ramp waveforms of opposite polarity, the two ADC acquisitions may be compared and the DC offset may be removed. The LMS algorithm does not require a priori knowledge of the RC time constant since the algorithm is able to estimate it. Accordingly, an ideal response of the ADC 130 may be determined. By comparing the computed ideal response of the ADC 130 with the de facto measured response of the ADC 130, INL correction values are determined. For reducing the impact of noise, the above processing may be repeated a number of times.

In summarizing the above, the processing circuit 170 is configured to determine one or more correction values for correcting a digital output value of the ADC 130 based on digital output values of the ADC 130 for the two reference inputs 111 and 112 by:
 a) determining a DC offset of the digital output values of the ADC 130 for the two reference inputs 111 and 112;
 b) modifying the digital output values of the ADC 130 for the two reference inputs 111 and 112 based on the determined DC offset for obtaining modified digital output values; and
 c) determining the one or more correction values based on one or more comparisons of the modified digital output values with reference output values for the two reference inputs 111 and 112.

In other words, the measured ADC output is fitted to reference data by applying regression techniques such as non-linear least-square estimations (e.g. calibration data to correct the ADC non-linearity may be computed in the digital domain by means of an LMS algorithm). In some examples, no closed-form solution may exist for the non-linear least-square estimation. As can be seen from FIG. 2, the exponential ramp waveforms used for calibration can be easily generated in the analog domain by charging and discharging an RC network. Accordingly, the complexity of the INL calibration may be shifted from the analog domain to the digital domain. Therefore, an overall complexity as well as costs of the INL calibration may be reduced.

For example, the proposed architecture may enable INL calibration of a SAR ADC with an exponential ramp reference.

It is to be noted that the RC circuit 150 described above in connection with FIG. 2 is merely exemplary and may be replaced by another RC circuit. Some exemplary further RC circuits will be described in the following in connection with FIGS. 3 and 5 to 7.

Figure 3:
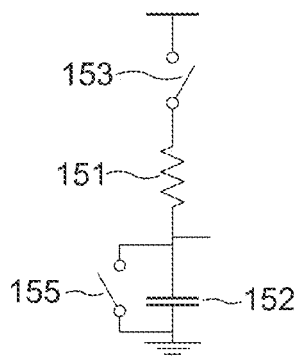
FIGS. 3 to 7 illustrate various examples of reference input generation circuits.

FIG. 3 illustrates a RC circuit 350 in a single-ended implementation. Similar to what is described above for RC circuit 150' illustrated in FIG. 4, the RC circuit 350 comprises a resistive element 151 and a capacitive element 152 coupled in series between a (first node at a) first potential (e.g. a supply voltage $V_{dd}$) and a (second node at a) second potential (e.g. ground or a supply voltage $V_{ss}$). If the switch 153 is closed, the capacitive element 152 is charged via the resistive element 151. If the switch 155 is closed, the capacitive element 152 is discharged.

Figure 5:
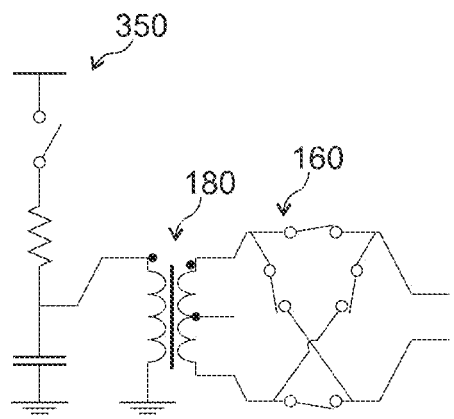

For example, the single-ended RC circuit 350 may be used instead of the RC circuit 150 in the apparatus 200. For converting the single-ended output of the RC circuit 350 to a differential output for the slope selection circuit 160, a balun may be used as illustrated in FIG. 5. The balun 180 is coupled between the RC circuit 350 and the slope selection circuit 160 for converting the single-ended signal of RC circuit 350 to a differential pair of signals for the slope selection circuit 160.

The RC circuits 150, 150' and 350 described above are configured to subsequently generate the two auxiliary ramp waveforms using the same RC time constant T. However, the proposed architecture is not limited thereto. In some examples, the reference input generation circuit may comprises an RC circuit that is configured to subsequently generate the two auxiliary ramp waveforms using different RC time constants. For example, an according RC circuit may be capable of controllably varying its resistance and/or its capacitance. Two exemplary RC circuits—one exhibiting a variable resistance and the other exhibiting a variable capacitance—will be described below in connection with FIGS. 6 and 7.

Figure 6:
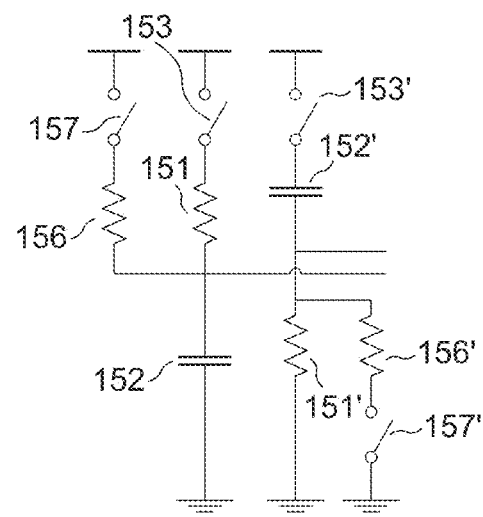

FIG. 6 illustrates an RC circuit 650. In comparison to the RC circuit 150, each branch of the RC circuit 650 comprises another resistive element 156, 156' and another switch 157, 157'. If the switches 157 and 157' are opened, the resistance of the branches is the same line for the RC circuit 150. If the switches 157, 157' are closed, the resistive elements 151 and 156 as well as the resistive elements 151' and 156' are coupled in parallel, respectively. Therefore, the resistance and, hence, the RC time constant of the RC circuit 650 is varied. By varying the RC time constant of the RC circuit 650, the slope of the exponential ramp waveform output by the RC circuit 650 is varied. Therefore, by subsequently charging the capacitive elements 152 and 152' using different settings for the switches 157 and 157' (i.e. both switches either closed or opened), two different auxiliary ramp waveforms are output by the RC circuit 650 which may be used as the ramp waveforms for calibrating the ADC. No polarity inversion is needed for the different auxiliary ramp waveforms output by the RC circuit 650. The switches for discharging the capacitive elements 152 and 152' are omitted in FIG. 6.

Figure 7:
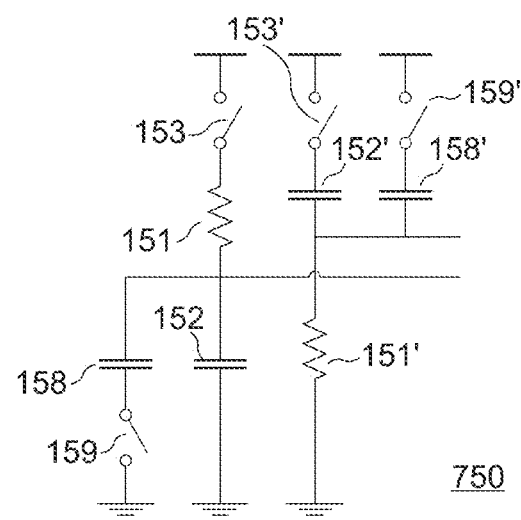

FIG. 7 illustrates an RC circuit 750. In comparison to the RC circuit 150, each branch of the RC circuit 750 comprises another capacitive element 158, 158' and another switch 159, 159'. If the switches 159 and 159' are opened, the capacitive of the branches is the same line for the RC circuit 150. If the switches 159, 159' are closed, the capacitive elements 152 and 158 as well as the capacitive elements 152' and 158' are coupled in parallel, respectively. Therefore, the capacitance and, hence, the RC time constant of the RC circuit 750 is varied.

By varying the RC time constant of the RC circuit 750, the slope of the exponential ramp waveform output by the RC circuit 750 is varied similar to what is described above for the change in resistance. Therefore, by using different settings for the switches 159 and 159' (i.e. both switches either closed or opened) for subsequently charging different total capacitances in the branches of the RC circuit 750, two different auxiliary ramp waveforms are output by the RC circuit 750 which may be used as the ramp waveforms for calibrating the ADC. No polarity inversion is needed for the different auxiliary ramp waveforms output by the RC circuit 750. The switches for discharging the capacitive elements 152, 152', 158 and 158' are omitted in FIG. 7.

In the above examples, an RC circuit is used for generating the auxiliary ramp waveforms. However, in some alternative examples, an LC or an LRC circuit may be used for subsequently generating two auxiliary ramp waveforms. Accordingly, each of the two reference inputs 111 and 112 may be based on one of the two auxiliary ramp waveforms provided by the LC or the LRC circuit. When using an LC or an LRC circuit, the above described slope selection circuit may be omitted.

Figure 9:
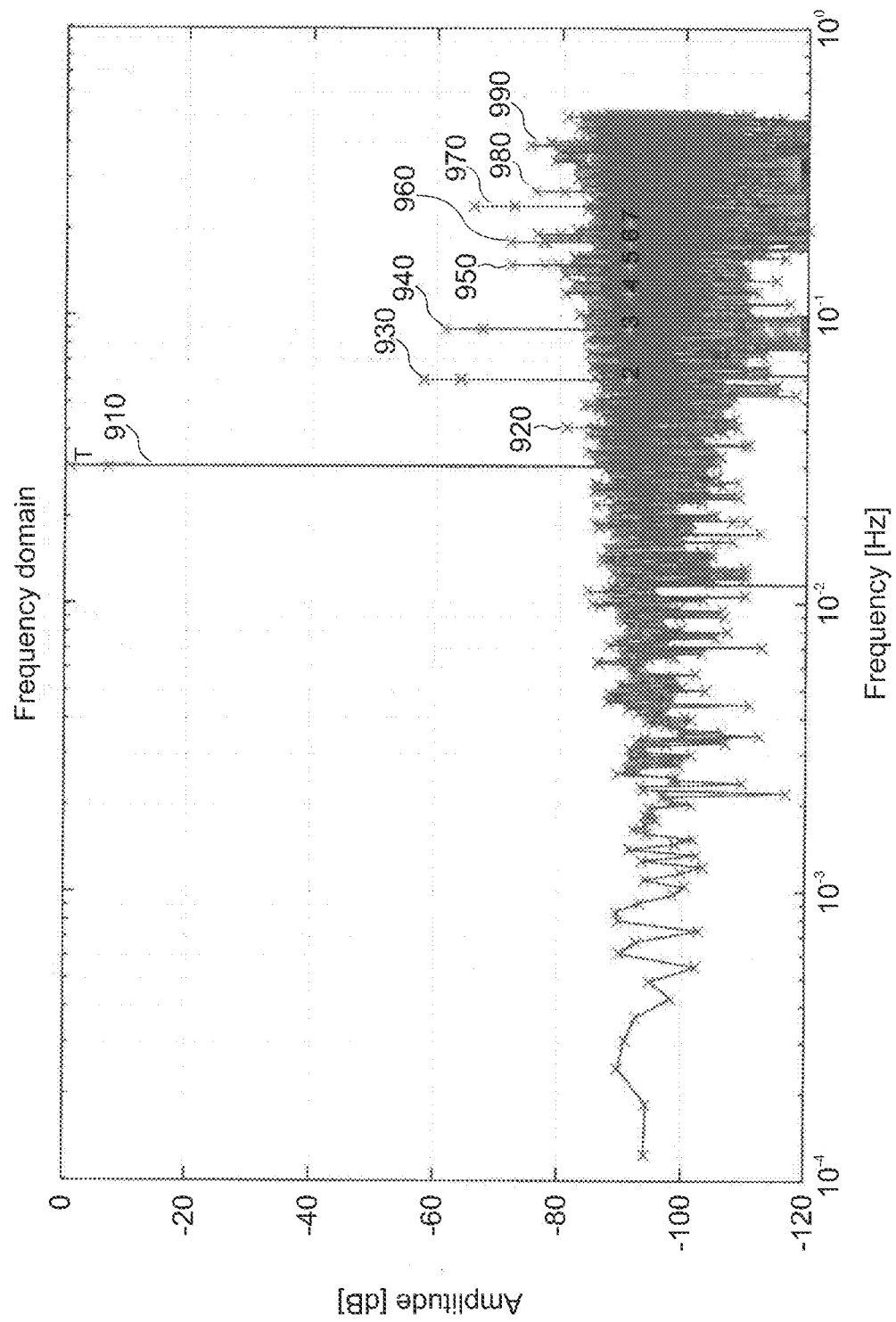
FIG. 9 illustrates an exemplary output spectrum of an uncalibrated ADC.
Figure 10:
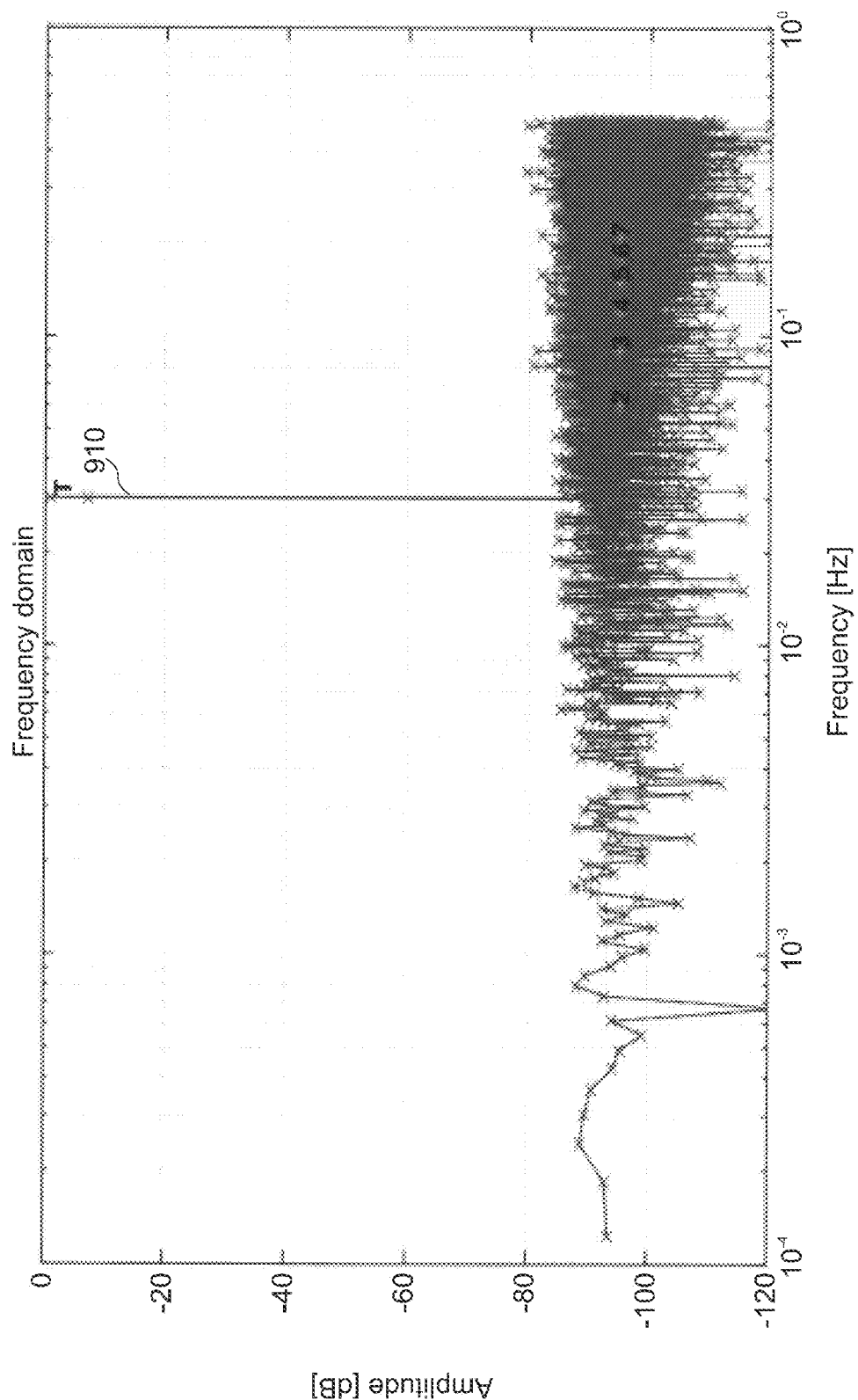
FIG. 10 illustrates an exemplary output spectrum of a calibrated ADC.

An effect of the proposed calibration on the ADC may be seem from FIGS. 9 and 10. FIG. 9 illustrates the output spectrum of an uncalibrated ADC. Apart from a desired frequency component 910, the frequency spectrum comprises a plurality of harmonic distortions denoted by reference numbers 920 to 990. As a comparison, the output spectrum for the same input of an ADC calibrated according to the above scheme is illustrated in FIG. 10. It can be seen from FIG. 10 that, due to the calibration, the harmonic distortions are suppressed compared to the spectrum illustrated in FIG. 9. Accordingly, a performance of the ADC is improved by the proposed calibration.

FIGS. 11A and 11B further illustrate the robustness of the proposed calibration to variations of the ramp waveforms represented by the two reference inputs. FIG. 11A illustrates the Spurious-Free Dynamic Ranges (SFDRs) of 128 uncalibrated ADCs. FIG. 11B illustrates the SFDRs of the 128 ADCs after being calibrated according to proposed scheme. The RC time constant of the RC circuit used for calibration was not known to the processing circuit during the calibration but estimated. It can be seen from FIGS. 11A and 11B that the SFDRs improved by approx. 20 dB. Further, a variation of the SFDRs is reduced due to the calibration.

Therefore, it may be concluded that the proposed INL calibration is robust to process variations and impairments. Further, the proposed INL calibration relies on a reference input which may be generated easily in the analog domain. In other words, the complexity of the INL calibration is shifted from the analog domain to the digital domain (e.g. by using a non-linear LMS algorithm instead of a linear LMS algorithm).

Figure 12:
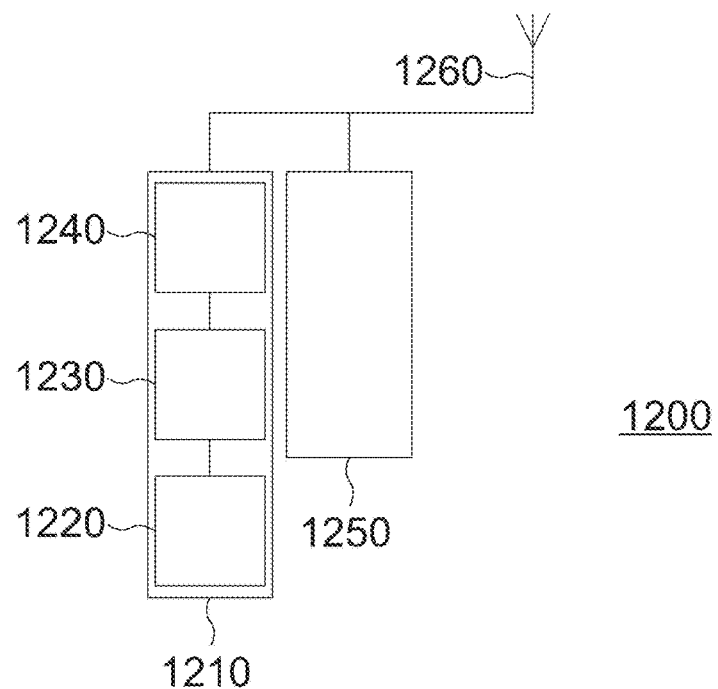
FIG. 12 illustrates an example of a base station.

An example of an implementation using ADC calibration according to one or more aspects of the architecture described above or one or more examples described above is illustrated in FIG. 12. FIG. 12 schematically illustrates an example of a radio base station 1200 (e.g. for a femtocell, a picocell, a microcell or a macrocell) comprising an apparatus 1230 for calibrating an ADC 1220 as proposed.

The ADC 1220 and the apparatus 1230 for calibrating the ADC 1220 are part of a receiver 1210. The receiver 1210 additionally comprises analog circuitry 1240 configured to receive a RF receive signal from an antenna element 1260 of the base station 1200. The analog circuitry 1240 is further configured to supply the analog signal for digitization to the signal node of the apparatus 1230 based on the RF receive signal. For example, the analog circuitry 1240 may comprise one or more of a filter, a down-converter (mixer) or a Low Noise Amplifier (LNA).

Further, the base station 1200 comprises a transmitter 1250 configured to generate a RF transmit signal. The transmitter 1250 may use the antenna element 1260 or another antenna element (not illustrated) of the base station 1200 for radiating the RF transmit signal to the environment.

To this end, a base station enabling improved offline calibration of the ADC may be provided. Accordingly, a performance of the ADC and, hence, the base station may be improved.

The base station 1200 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (JO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 13:
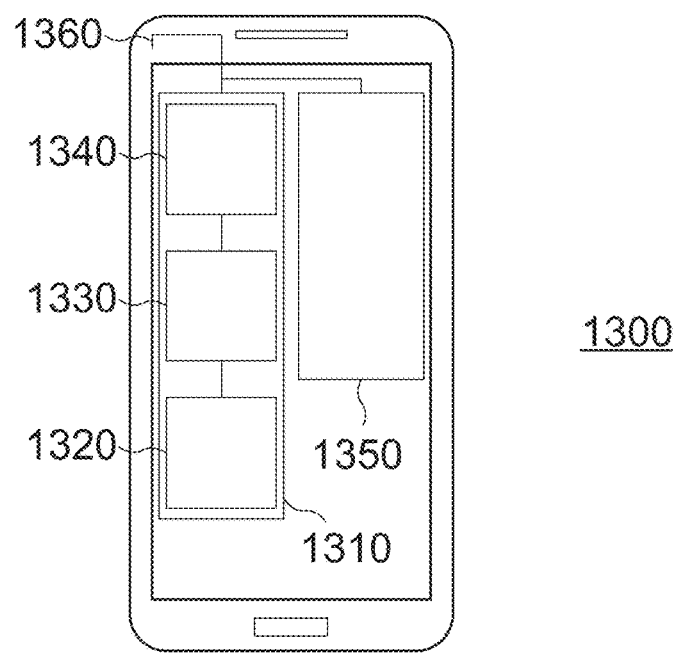
FIG. 13 illustrates an example of a mobile device.

Another example of an implementation using ADC calibration according to one or more aspects of the architecture described above or one or more examples described above is illustrated in FIG. 13. FIG. 13 schematically illustrates an example of a mobile device 1300 (e.g. mobile phone, smartphone, tablet-computer, or laptop) comprising an apparatus 1330 for calibrating an ADC 1320 as proposed.

The ADC 1320 and the apparatus 1330 for calibrating the ADC 1320 are part of a receiver 1310. The receiver 1310 additionally comprises analog circuitry 1340 configured to receive a RF receive signal from an antenna element 1360 of the mobile device 1300. The analog circuitry 1340 is further configured to supply the analog signal for digitization to the signal node of the apparatus 1330 based on the RF receive signal. For example, the analog circuitry 1340 may comprise one or more of a filter, a down-converter (mixer) or a LNA.

Further, the mobile device 1300 comprises a transmitter 1350 configured to generate a RF transmit signal. The transmitter 1350 may use the antenna element 1360 or another antenna element (not illustrated) of the mobile device 1300 for radiating the RF transmit signal to the environment.

To this end, a mobile device enabling improved offline calibration of the ADC may be provided. Accordingly, a performance of the ADC and, hence, the mobile device may be improved.

The mobile device 1300 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (JO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using ADC calibration according to the proposed architecture or one or more of the examples described above may be configured to operate according to one of the 3GPP-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is an apparatus for calibrating an ADC, the apparatus comprising: a reference input generation circuit configured to subsequently generate two reference inputs for calibrating the ADC, wherein the two reference inputs both represent ramp waveforms, wherein the ramp waveforms represented by the two reference inputs are different from each other; and a coupling circuit configured to controllably couple an input node of the ADC to either the reference input generation circuit or to a signal node capable of providing an analog input for digitization.

Example 2 is the apparatus of example 1, wherein the coupling circuit is configured to controllably couple the input node of the ADC to either the reference input generation circuit or to the signal node based on a control input indicative of a desired operation mode of the ADC.

Example 3 is the apparatus of example 1 or example 2, wherein the ramp waveforms represented by the two reference inputs exhibit different slopes.

Example 4 is the apparatus of example 1 or example 2, wherein the ramp waveforms represented by the two reference inputs exhibit opposite slopes.

Example 5 is the apparatus of example 1 or example 2, wherein the ramp waveforms represented by the two reference inputs are exponential ramps.

Example 6 is the apparatus of any of example 1 to 5, wherein the reference input generation circuit comprises an RC circuit configured to subsequently generate two auxiliary ramp waveforms, and wherein each of the two reference inputs is based on one of the two auxiliary ramp waveforms.

Example 7 is the apparatus of example 6, wherein a RC time constant of the RC circuit is proportional to a bit resolution of the ADC.

Example 8 is the apparatus of example 6 or example 7, wherein a RC time constant of the RC circuit is inversely proportional to a sample rate of the ADC.

Example 9 is the apparatus of any of examples 6 to 8, wherein a RC time constant of the RC circuit is inversely proportional to a full scale of the ADC.

Example 10 is the apparatus of any of examples 6 to 9, wherein a RC time constant τ of the RC circuit is defined as follows:

$$\tau \geq \frac{2^n \cdot G}{F_{FS} \cdot F_{ADC}},$$

with n denoting the bit resolution of the ADC, $F_{ADC}$ denoting the sample rate of the ADC, $F_{FS}$ denoting the full scale of the ADC, and G denoting a gain of elements coupled between the coupling circuit and the ADC.

Example 11 is the apparatus of any of examples 6 to 10, wherein the RC circuit is configured to subsequently generate the two auxiliary ramp waveforms using different RC time constants.

Example 12 is the apparatus of any of examples 6 to 10, wherein the RC circuit is configured to subsequently generate the two auxiliary ramp waveforms using the same RC time constant.

Example 13 is the apparatus of any of examples 6 to 12, wherein the two auxiliary ramp waveforms are each represented by a single-ended signal, and wherein the reference input generation circuit further comprises: a balun coupled to the RC circuit and configured to convert the single-ended signal to a differential pair of signals; and a slope selection circuit coupled to the balun and configured to selectively output a first one of the differential pair of signals to a first output node of the reference input generation circuit and a second one of the differential pair of signals to a second output node of the reference input generation circuit in order to provide a first one of the two reference inputs for calibrating the ADC, and to subsequently output the second one of the differential pair of signals to the first output node of the reference input generation circuit and the first one of the differential pair of signals to the second output node of the reference input generation circuit in order to provide a second one of the two reference inputs for calibrating the ADC.

Example 14 is the apparatus of any of examples 6 to 12, wherein the two auxiliary ramp waveforms are each represented by a differential pair of signals, and wherein the reference input generation circuit further comprises: a slope selection circuit configured to selectively output a first one of the differential pair of signals to a first output node of the reference input generation circuit and a second one of the differential pair of signals to a second output node of the reference input generation circuit in order to provide a first one of the two reference inputs for calibrating the ADC, and to subsequently output the second one of the differential pair of signals to the first output node of the reference input generation circuit and the first one of the differential pair of signals to the second output node of the reference input generation circuit in order to provide a second one of the two reference inputs for calibrating the ADC.

Example 15 is the apparatus of any of examples 6 to 13, wherein the RC circuit is capable of controllably varying its resistance and/or its capacitance.

Example 16 is the apparatus of any of example 1 to 5, wherein the reference input generation circuit comprises an LC circuit configured to subsequently generate two auxiliary ramp waveforms, and wherein each of the two reference inputs is based on one of the two auxiliary ramp waveforms.

Example 17 is the apparatus of any of examples 1 to 16, further comprising a processing circuit configured to determine one or more correction values for correcting a digital output value of the ADC based on digital output values of the ADC for the two reference inputs.

Example 18 is the apparatus of example 17, wherein the processing circuit is configured to determine the one or more correction values by: determining a DC offset of the digital output values of the ADC for the two reference inputs; modifying the digital output values of the ADC for the two reference inputs based on the determined DC offset for obtaining modified digital output values; and determining the one or more correction values based on one or more comparisons of the modified digital output values with reference output values for the two reference inputs.

Example 19 is a receiver, comprising: an ADC; and an apparatus for calibrating an ADC according to any of examples 1 to 18.

Example 20 is the receiver of example 19, further comprising: analog circuitry configured to receive a RF receive signal from an antenna element, and to supply the analog signal for digitization to the signal node based on the RF receive signal.

Example 21 is a base station, comprising: a receiver according to example 19 or example 20; and a transmitter configured to generate a RF transmit signal.

Example 22 is the base station of example 21, further comprising at least one antenna element coupled to at least one of the receiver and the transmitter.

Example 23 is a mobile device, comprising: a receiver according to example 19 or example 20; and a transmitter configured to generate a RF transmit signal.

Example 24 is the mobile device of example 23, further comprising at least one antenna element coupled to at least one of the receiver and the transmitter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown.

Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or—steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for calibrating an analog-to-digital converter, the apparatus comprising:
   a reference input generation circuit configured to subsequently generate two reference inputs for calibrating the analog-to-digital converter, wherein the two reference inputs both represent ramp waveforms, wherein the ramp waveforms represented by the two reference inputs are different from each other; and
   a coupling circuit configured to controllably couple an input node of the analog-to-digital converter to either the reference input generation circuit or to a signal node capable of providing an analog input for digitization.

2. The apparatus of claim 1, wherein the coupling circuit is configured to controllably couple the input node of the analog-to-digital converter to either the reference input generation circuit or to the signal node based on a control input indicative of a desired operation mode of the analog-to-digital converter.

3. The apparatus of claim 1, wherein the ramp waveforms represented by the two reference inputs exhibit different slopes.

4. The apparatus of claim 1, wherein the ramp waveforms represented by the two reference inputs exhibit opposite slopes.

5. The apparatus of claim 1, wherein the ramp waveforms represented by the two reference inputs are exponential ramps.

6. The apparatus of claim 1, wherein the reference input generation circuit comprises an RC circuit configured to subsequently generate two auxiliary ramp waveforms, and wherein each of the two reference inputs is based on one of the two auxiliary ramp waveforms.

7. The apparatus of claim 6, wherein a RC time constant of the RC circuit is proportional to a bit resolution of the analog-to-digital converter.

8. The apparatus of claim 6, wherein a RC time constant of the RC circuit is inversely proportional to a sample rate of the analog-to-digital converter.

9. The apparatus of claim 6, wherein a RC time constant of the RC circuit is inversely proportional to a full scale of the analog-to-digital converter.

10. The apparatus of claim 6, wherein a RC time constant $\tau$ of the RC circuit is defined as follows:

$$\tau \geq \frac{2^n \cdot G}{F_{FS} \cdot F_{ADC}},$$

with n denoting the bit resolution of the analog-to-digital converter, $F_{ADC}$ denoting the sample rate of the analog-to-digital converter, $F_{FS}$ denoting the full scale of the analog-to-digital converter, and G denoting a gain of elements coupled between the coupling circuit and the analog-to-digital converter.

11. The apparatus of claim 6, wherein the RC circuit is configured to subsequently generate the two auxiliary ramp waveforms using different RC time constants.

12. The apparatus of claim 6, wherein the RC circuit is configured to subsequently generate the two auxiliary ramp waveforms using the same RC time constant.

13. The apparatus of claim 6, wherein the two auxiliary ramp waveforms are each represented by a single-ended signal, and wherein the reference input generation circuit further comprises:
 a balun coupled to the RC circuit and configured to convert the single-ended signal to a differential pair of signals; and
 a slope selection circuit coupled to the balun and configured to selectively output a first one of the differential pair of signals to a first output node of the reference input generation circuit and a second one of the differential pair of signals to a second output node of the reference input generation circuit in order to provide a first one of the two reference inputs for calibrating the analog-to-digital converter, and to subsequently output the second one of the differential pair of signals to the first output node of the reference input generation circuit and the first one of the differential pair of signals to the second output node of the reference input generation circuit in order to provide a second one of the two reference inputs for calibrating the analog-to-digital converter.

14. The apparatus of claim 6, wherein the two auxiliary ramp waveforms are each represented by a differential pair of signals, and wherein the reference input generation circuit further comprises:
 a slope selection circuit configured to selectively output a first one of the differential pair of signals to a first output node of the reference input generation circuit and a second one of the differential pair of signals to a second output node of the reference input generation circuit in order to provide a first one of the two reference inputs for calibrating the analog-to-digital converter, and to subsequently output the second one of the differential pair of signals to the first output node of the reference input generation circuit and the first one of the differential pair of signals to the second output node of the reference input generation circuit in order to provide a second one of the two reference inputs for calibrating the analog-to-digital converter.

15. The apparatus of claim 6, wherein the RC circuit is capable of controllably varying its resistance and/or its capacitance.

16. The apparatus of claim 1, wherein the reference input generation circuit comprises an LC circuit configured to subsequently generate two auxiliary ramp waveforms, and wherein each of the two reference inputs is based on one of the two auxiliary ramp waveforms.

17. The apparatus of claim 1, further comprising a processing circuit configured to determine one or more correction values for correcting a digital output value of the analog-to-digital converter based on digital output values of the analog-to-digital converter for the two reference inputs.

18. The apparatus of claim 17, wherein the processing circuit is configured to determine the one or more correction values by:
 determining a DC offset of the digital output values of the analog-to-digital converter for the two reference inputs;
 modifying the digital output values of the analog-to-digital converter for the two reference inputs based on the determined DC offset for obtaining modified digital output values; and
 determining the one or more correction values based on one or more comparisons of the modified digital output values with reference output values for the two reference inputs.

19. A receiver, comprising:
an analog-to-digital converter; and
an apparatus for calibrating an analog-to-digital converter according to claim 1.

20. The receiver of claim 19, further comprising:
analog circuitry configured to receive a radio frequency receive signal from an antenna element, and to supply the analog signal for digitization to the signal node based on the radio frequency receive signal.

* * * * *